(12) United States Patent
Isogai et al.

(10) Patent No.: US 6,978,041 B2
(45) Date of Patent: Dec. 20, 2005

(54) REVIEW WORK SUPPORTING SYSTEM

(75) Inventors: Seiji Isogai, Hitachinaka (JP); Hitoshi Komuro, Hitachinaka (JP); Hideo Wada, Hitachinaka (JP); Katsuharu Shoda, Sendai (JP)

(73) Assignee: Hitachi, Ltd., Tokyo (JP)

( * ) Notice: Subject to any disclaimer, the term of this patent is extended or adjusted under 35 U.S.C. 154(b) by 503 days.

(21) Appl. No.: 10/096,917

(22) Filed: Mar. 14, 2002

(65) Prior Publication Data
US 2002/0196968 A1 Dec. 26, 2002

(30) Foreign Application Priority Data

Jun. 25, 2001 (JP) .............................. 2001-191519

(51) Int. Cl.[7] .............................................. G06K 9/00
(52) U.S. Cl. ........................ 382/149; 29/833; 348/126; 700/110; 700/121; 700/143
(58) Field of Search ................................ 382/100, 141, 382/145, 147, 149; 29/833; 438/16; 348/86, 348/87, 88, 91, 125, 126, 128, 129, 130, 348/133; 700/95, 109, 110, 121, 143

(56) References Cited

U.S. PATENT DOCUMENTS

| 4,219,277 | A | * | 8/1980 | Yaroshuk et al. ........... 356/431 |
| 5,917,935 | A | * | 6/1999 | Hawthorne et al. ......... 382/149 |
| 6,002,989 | A | | 12/1999 | Shiba et al. |
| 6,091,847 | A | * | 7/2000 | Chiu et al. .................. 382/149 |
| 6,156,580 | A | * | 12/2000 | Wooten et al. ................ 438/16 |
| 6,246,472 | B1 | * | 6/2001 | Yoda et al. ............... 356/237.2 |
| 6,456,951 | B1 | | 9/2002 | Maeda et al. |
| 2001/0048761 | A1 | * | 12/2001 | Hamamatsu et al. ........ 382/149 |
| 2003/0058444 | A1 | * | 3/2003 | Nara et al. .................. 356/394 |
| 2004/0047500 | A1 | * | 3/2004 | Taguchi et al. ............. 382/149 |

FOREIGN PATENT DOCUMENTS

| JP | 09-019853 | 1/1997 |
| JP | 09-269294 | 10/1997 |
| JP | 2000-30652 | 1/2000 |
| JP | 2000-306964 | 11/2000 |
| JP | 2001-156135 | 6/2001 |
| JP | 3255292 | 11/2001 |

* cited by examiner

Primary Examiner—Samir Ahmed
Assistant Examiner—Anand Bhatnagar
(74) Attorney, Agent, or Firm—Dickstein Shapiro Morin & Oshinsky LLP

(57) ABSTRACT

An object of the present invention is to increase efficiency in review work by appropriately narrowing down review work that verifies shapes of visual defects relating to an enormous amount of defects detected by a visual inspecting apparatus with high sensitivity. In order to appropriately extract defect information from an inspecting apparatus, a filter function and a sampling function are prepared by unitizing the functions. As a result, defects as review targets are narrowed down and extracted automatically using the filter function and the sampling function in combination. In addition, sequencing the filter conditions and the sampling conditions and registering the sequence enables automatic filtering and sampling on the basis of information on a wafer as a review target, and thereby only defect information on the review target is extracted.

4 Claims, 5 Drawing Sheets

REVIEW WORK SUPPORTING SYSTEM

BACKGROUND OF THE INVENTION

The present invention relates to review work for observing products in process and parts, and more particularly to a system for supporting review work that verifies outward appearance of dust particles and pattern defects on surfaces of a semiconductor wafer, a photo mask, a magnetic disk, and the like.

In semiconductor manufacturing processes, a dust particle and a pattern defect on a surface of a wafer cause a product defect. Therefore, it is necessary to quantify dust particles and pattern defects (hereinafter referred to as visual defect), and to continuously monitor whether or not there are problems in production equipment and production environment. Moreover, by observing a shape of the visual defect, it is necessary to verify whether or not a visual defect will exert critical influence on a product.

Because of microminiaturization relating to a semiconductor device, capability and performance enough to detect a minuter visual defect are required for an inspecting apparatus. Responding to such request, an inspecting apparatus, which can detect a visual defect with high sensitivity, is emerging. Review work for observing a shape of a visual defect on the basis of an enormous amount of defect information extracted by such an inspecting apparatus is important for improvement in yields.

Conventionally, such review work for observing a shape was often performed by manual operation. Because of it, there were the following problems: positions of defects as review targets deviated depending on an observer; and defects, which should be reviewed, were not uniformly determined. Recently, for the purpose of solving the problems, the following techniques have been introduced: ADR (Automatic Defect Review); and ADC (Automatic Defect Classification).

As regards inventions that improve efficiency in defect review, those disclosed in ① Japanese Patent Laid-Open No. Hei 7-92094, ② Japanese Patent Laid-Open No. Hei 9-191032, ③ Japanese Patent Laid-Open No. Hei 11-214462, ④ Japanese Patent Laid-Open No. 2000-332071, and the like, are known.

Because sensitivity of an inspecting apparatus becomes higher, detection of a minute defect becomes possible. As a result of it, the number of detected defects is enormously growing. Therefore, it is impossible to observe all of the defects one by one during the so-called review work for verifying a shape of a visual defect. In order to use the automation technique described above effectively, a technique for appropriately extracting information on defects as review targets from defect information, which has been obtained from an inspecting apparatus, is required.

The invention, which was disclosed in each of the official gazettes, is not enough to increase efficiency in the review work.

SUMMARY OF THE INVENTION

An object of the present invention is to increase efficiency in review work by appropriately selecting information on defects, which should be reviewed, from an enormous amount of defect information output from an inspecting apparatus.

In addition, another object of the present invention is to increase efficiency in review work by automatically determining the most effective review apparatus for review based on the selected information on defects and information on the review apparatus.

The present invention is mainly characterized in that in order to appropriately extract defect information obtained from an inspecting apparatus, a plurality of selection conditions are prepared so that defects as review targets are extracted automatically using the selection conditions in combination.

The following combinations are preferable as the plurality of selection conditions: (1) a combination of a filter function, which narrows down many defects according to sorting criteria corresponding to characteristics of a defect of a scheduled item, and a sampling function that narrows down defect data according to a scheduled rule; (2) a combination of items, relating to a filter function of narrowing down many defects according to sorting criteria corresponding to characteristics of a defect for a plurality of items; (3) a combination of rules, relating to a sampling function of narrowing down defect data according to a plurality of rules; (4) a combination of (2) and (3); and the like. Efficiency in review work can be improved by using the above.

Another characteristic of the present invention is that filter conditions and sampling conditions are sequenced and registered, and then automatic filtering and sampling are performed on the basis of information on a wafer as a review target in order to extract defects as review targets.

In addition, another characteristic of the present invention is that according to one selection condition selected from among a plurality of selection conditions for narrowing down a large amount of defect information, one review apparatus is selected from a plurality of review apparatuses.

The characteristics described above enable appropriate selection of information on defects that should be reviewed, and automatic determination of the most effective review apparatus. As a result, efficiency in review work can be improved.

BRIEF DESCRIPTION OF THE DRAWINGS

The above and other objects, features and advantages of the present invention will become more apparent from the following description taken in connection with the accompanying drawings, in which.

DETAILED DESCRIPTION OF THE PREFERRED EMBODIMENTS

Preferred embodiments of the present invention will be described hereinafter with reference to drawings.

Figure 1:
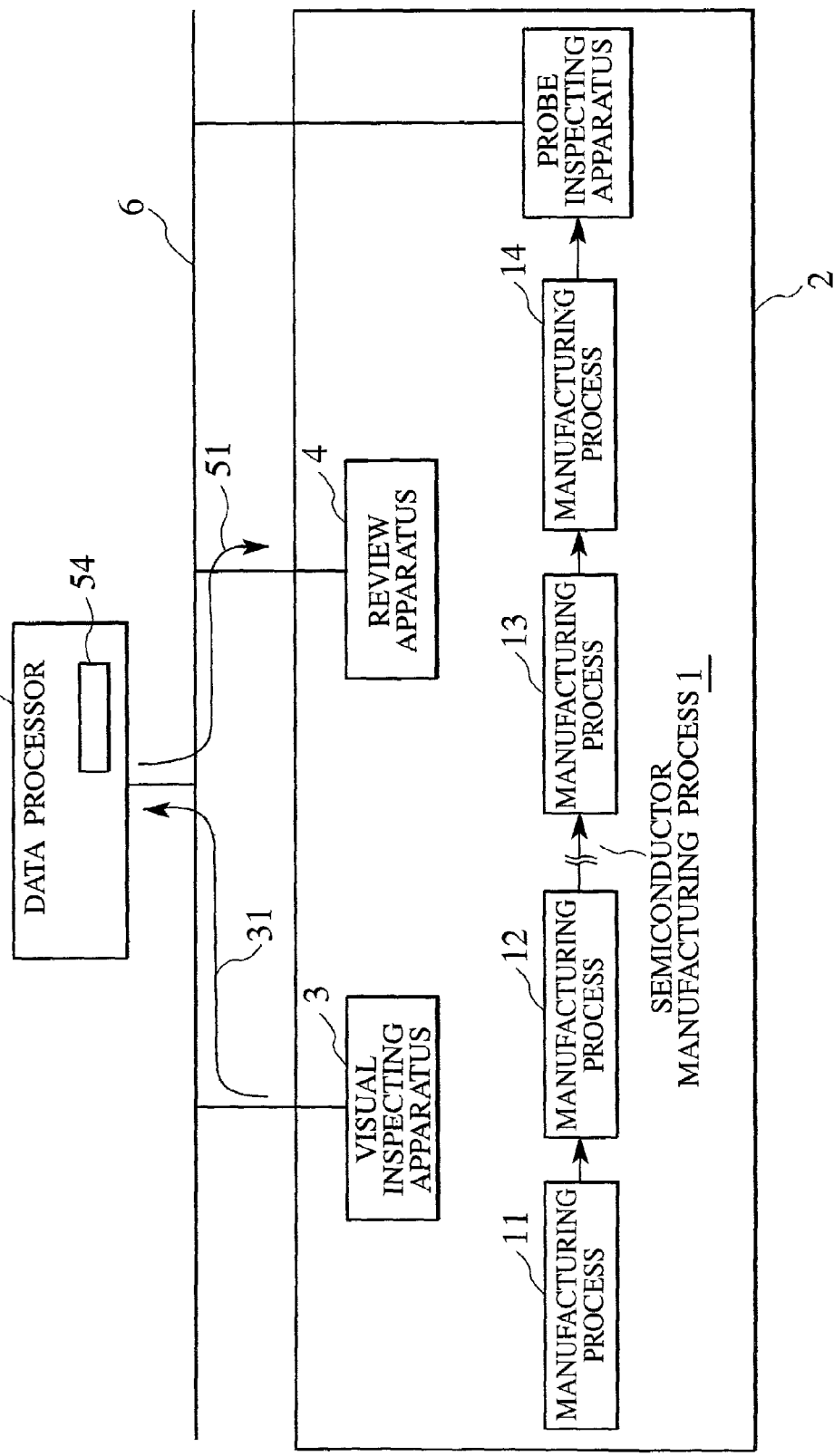
FIG. 1 is a configuration diagram illustrating a review work supporting system as a whole according to one embodiment of the present invention.

FIG. 1 is a configuration diagram illustrating a review work supporting system as a whole according to one embodiment of the present invention. An example, in which the present invention is applied to a semiconductor production line, will be described as below. A semiconductor manufacturing process 1 is constituted of manufacturing processes 11 through 14, and is carried out in a clean room 2 where clean environment is usually kept. In the clean room 2, a visual inspecting apparatus 3 for detecting a visual defect on a product wafer, and a review apparatus 4 for observing (reviewing) a visual defect according to data from the visual inspecting apparatus, are placed. The visual inspecting apparatus 3 and the review apparatus 4 are connected to a data processor 5, which is used for receiving or transferring inspection data, via a communication line 6.

Wafers as products flow along the semiconductor manufacturing process 1 on a lot basis. For the visual inspection, after completing a process for which visual inspection has been decided to be performed beforehand, the wafers are carried to the visual inspecting apparatus 3 by an operator or a carrier and then inspection processing is performed.

Defect information 31 obtained when the visual inspection is performed is managed by the data processor 5 using data including ① lot number, ② wafer number, ③ inspection process, and ④ inspection date and time. The wafer for which the visual inspection has been finished is carried to the review apparatus 4 in order to observe a visual defect. Then, predetermined wafers are taken out from a lot to perform review there. When performing the review, defect information 51 is obtained from the data processor 5 using information on a wafer as a review target (that is to say, ① lot number, ② wafer number, and ③ inspection process) as key information.

Because the defect information 31 output by the visual inspecting apparatus 3 is an enormous amount of data, it is not possible to treat all of the defect information as defects for review targets. For this reason, it is necessary to extract the defect information 51, which should be reviewed, from the defect information 31 obtained from the inspecting apparatus 3 by some means. The processing is executed in the data processor 5 using a filter and a sampler function stored in a storage device 54.

Figure 2:
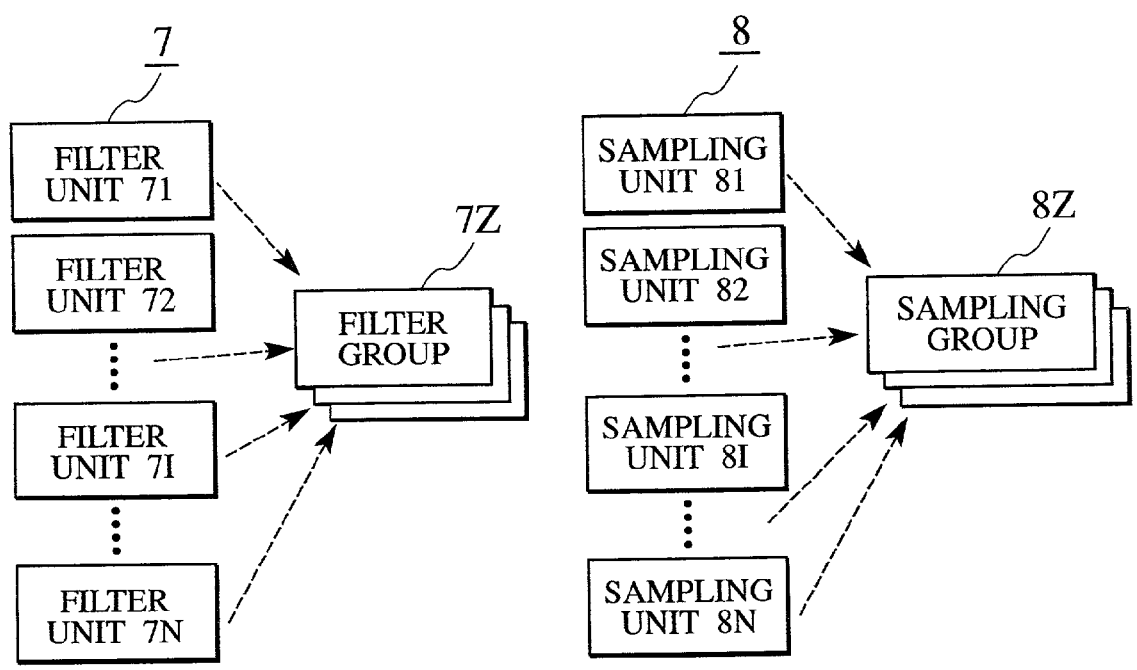
FIG. 2 is an explanatory diagram illustrating a function of defect-information extraction processing according to one embodiment of the present invention.

FIG. 2 is an explanatory diagram illustrating defect-information extraction processing according to one embodiment of the present invention. The defect-information extraction processing is a function that is stored in the storage device 54, and that is executed by the data processor 5. Because defects, which should be actually reviewed, are extracted from a large quantity of defect data detected by the inspecting apparatus 3, a filter 7, which include a plurality of filter units 71, 72, ... 7I, ... 7N, is prepared.

Each of the filter units 71, 72, ... 7I, ... 7N is used as an independent unit. The filter units can be used as a filter group 7Z into which a user combines desired filter units as the need arises. In addition, a series of combined filter groups 7Z can be sequenced. After that, the sequenced filter groups 7Z can be stored and saved while they are linked to information on a wafer as a review target. The information about a wafer includes an inspecting apparatus, a product name, and a process name.

A filter function in each filter unit is a function of narrowing down many defects according to sorting criteria corresponding to characteristics of a defect on an item basis. The following are examples of the filter function.

(1) Category:
A filter to perform an operation for category numbers obtained by classifying defects using the inspecting apparatus 3 or another review apparatus. This filter can be used for the second review work or later.

(2) Defect Size:
A filter to perform an operation for the size of a defect that has been detected by the inspecting apparatus 3. A projected length in an X direction, a projected length in a Y direction, an area, or the like, can be specified as the size. In response to the existing conditions, particular large or small defects can be excluded.

(3) Defect Detected Before this Process:
A filter that classifies defects into two groups: a defect that has already been detected in the inspection process before this inspection process; and a defect that has been detected in this process for the first time. Using this filter permits defects to be narrowed down to defects that have been inspected/reviewed. Or, the defects that have been inspected/reviewed can be excluded in reverse.

(4) Common Defect Among Wafers:
A filter to perform an operation for defects common to a plurality of wafers in the same lot. Using this filter permits defects to be narrowed down to common defects, or the common defects can be excluded.

(5) Defect Caused by a Mask:
A filter to perform an operation for defects that are common among shots in a wafer.

Next, samplers 8 are provided in addition to the filters 7. Defect data is further selected by the samplers 8 from a defect data group, to which defects have been narrowed down to some extent by the filter functions of the filters 7, according to a specified rule in order to further narrow down the defect data that should be reviewed.

The sampler 8 includes sampling units 81, 82, ... 8I, ... 8N. Each of the sampling units 81, 82, ... 8I, ... 8N is also used as an independent unit. The sampling units can be used as a sampling group 8Z into which a user combines desired sampling units as the need arises. In addition, a series of combined sampling groups 8Z can be sequenced. After that, the sequenced sampling groups 8Z can be stored and saved while they are linked to information on a wafer as a review target. The information includes an inspecting apparatus, a product name, and a process name.

As examples of a sampling function in each sampling unit, which extracts defects from many defects, the following can be named.

(1) Random:
This sampling function uniformly samples defects from defects in the whole wafer.

(2) Cluster:
This sampling function uniformly samples defects from defects constituting the same cluster.

(3) Die Specification:
This is an automatic sampling function using sampling by specification of a die position (X, Y) and using defect density.

(4) Division into Concentric Circles:
A wafer is divided into a plurality of parts by concentric circles, and then defects are sampled by specifying a ratio for each of the divided parts.

(5) Division into Angles:

A wafer is divided into a plurality of parts in a circumferential direction, and then defects are sampled by specifying a ratio for each of the divided parts.

Figure 3:
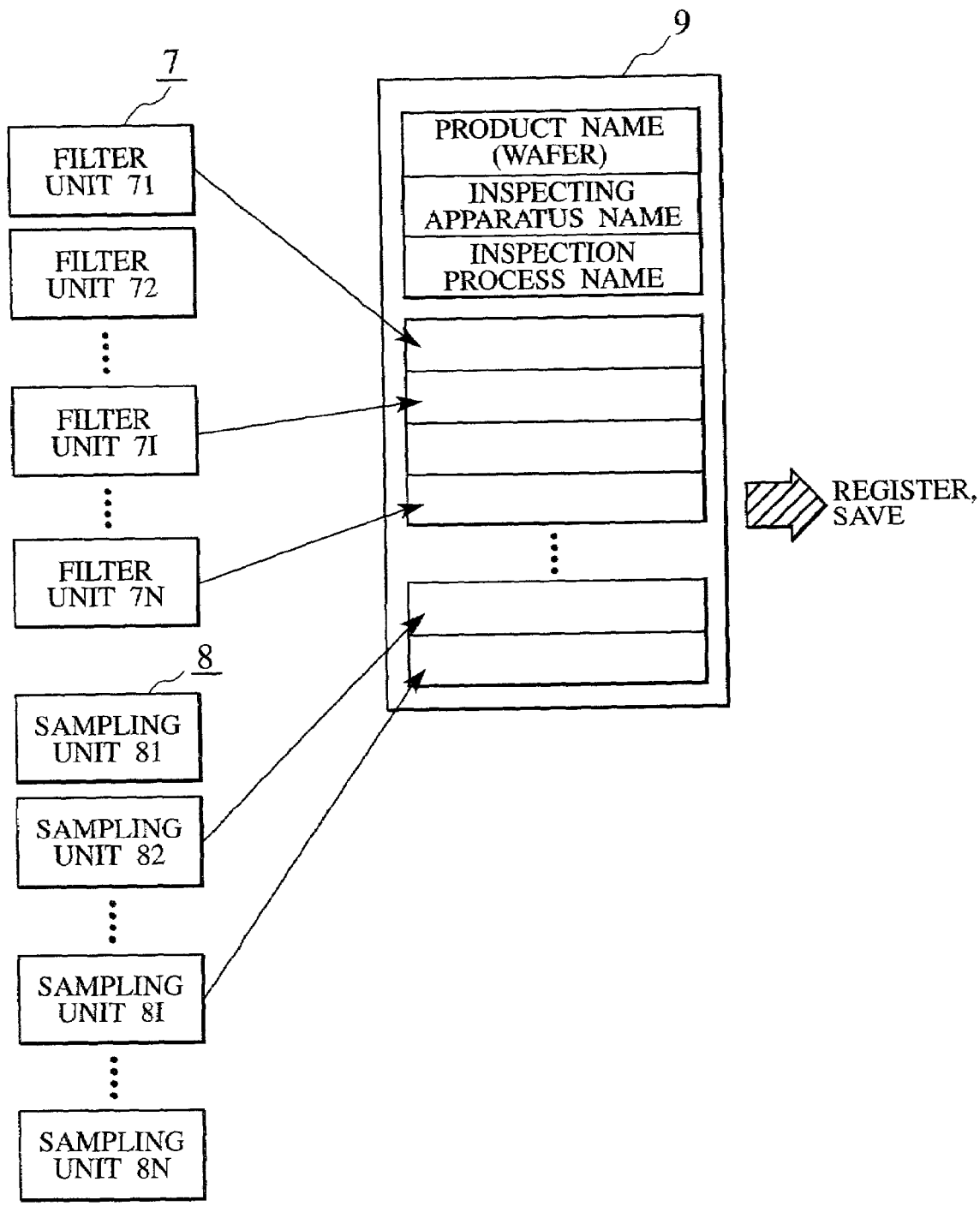
FIG. 3 is an explanatory diagram illustrating sequencing of a filtering function and a sampling function.

FIG. 3 is an explanatory diagram illustrating sequencing of the filtering function and the sampling function. A filter unit group, which will be used at the time of review, is selected from the filter 7, and a sampling unit group is selected from the sampler 8. Then, both of the groups are registered as one sequence 9. At the time of the registration, the sequence 9 is registered in association with a product (wafer) name, an inspecting apparatus name, and an inspection process name as information on a wafer as a review target. Required filtering and required sampling are automatically performed for a determined review target by the thus set sequence, which enables extraction of defects that should be reviewed.

In this embodiment, the review work supporting system comprises the visual inspecting apparatus 3 for detecting an abnormal condition of outward appearance of an object to be inspected (for example, a semiconductor wafer) to output the defect information 31; the review apparatus 4 for verifying a defect on the basis of the defect information; and the data processor 5 that receives or transfers information between the visual inspecting apparatus 3 and the review apparatus 4. In this case, the data processor 5 comprises the storage device 54 for registering the sequence 9 that combines and sequences filter conditions, which are used for narrowing down defect information according to sorting criteria corresponding to defect characteristics for a plurality of items (filter units 71 through 7N), and sampling conditions, which are used for narrowing down defect data according to a plurality of rules (sampling units 81 through 8N); a means (data processor 5) for narrowing down defect information on a review target by reading the conditions, which have been registered on the basis of information on a wafer as the review target, and by filtering and sampling the defect information using the read conditions; and a means (data processor 5, and communication line 6) for transmitting the defect information, which has been narrowed down, to the review apparatus 4.

Figure 4:
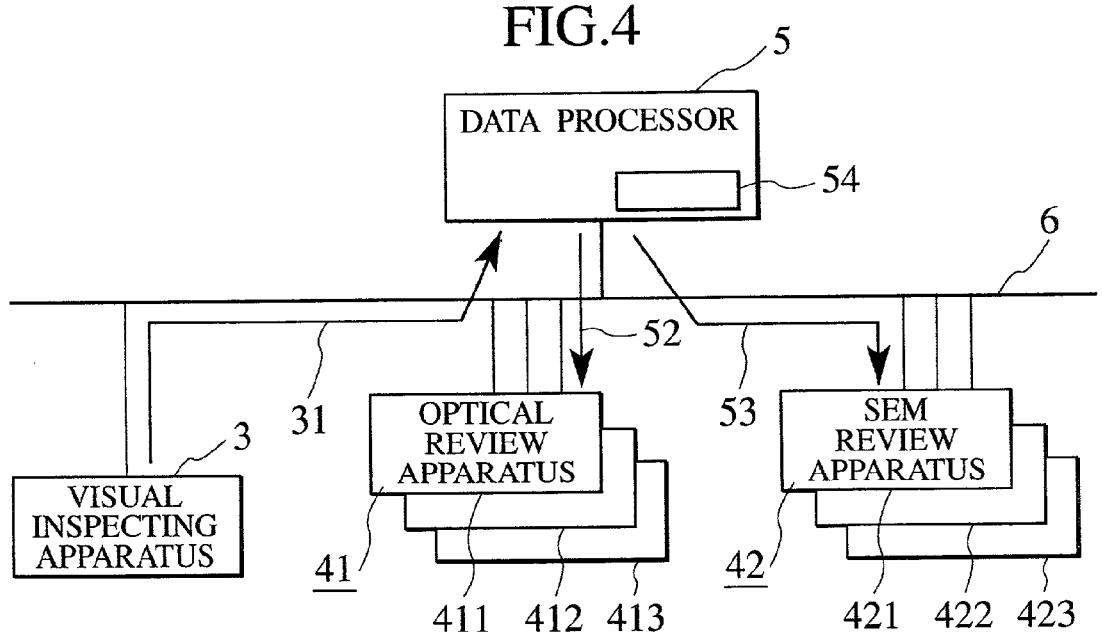
FIG. 4 is a configuration diagram illustrating a review work supporting system as a whole according to another embodiment of the present invention.

FIG. 4 is a configuration diagram illustrating a review work supporting system as a whole according to another embodiment of the present invention. In a usual semiconductor manufacturing process, two or more kinds of review apparatuses are often provided as shown in FIG. 4. A typical review apparatus used for review includes an optical review apparatus 41 that uses usual white light, and a SEM review apparatus 42 that uses an electron beam. In addition, a plurality of review apparatuses of the same kind are placed as shown by reference numerals 411 through 413 and reference numerals 421 through 423. The optical review apparatus 41 has the following advantages: a defect in a lower layer can be reviewed; and classification by color information is possible. On the contrary, the optical review apparatus 41 has a disadvantage that a minute defect cannot be reviewed because of low resolution. On the other hand, the SEM review apparatus 42 enables an operator to observe a minute defect because of high resolution. However, on the contrary, review is limited to a defect that exists on a surface, in other words, a defect in a lower layer cannot be reviewed. In this manner, because the quality of a defect, which can be reviewed, is different depending on a kind of a review apparatus, it is necessary to select a review apparatus according to a defect that should be reviewed.

Figure 5:
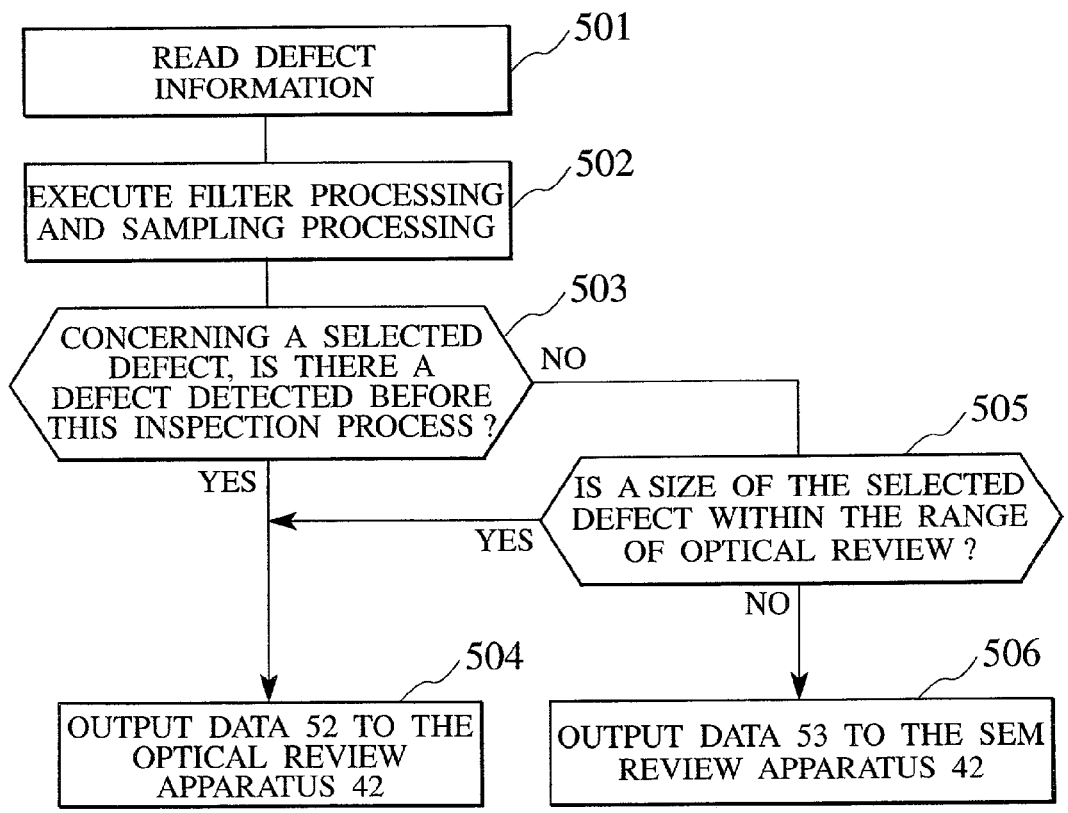
FIG. 5 is a flowchart illustrating processing that automatically judges a kind of a review apparatus.

FIG. 5 is a flowchart illustrating processing that automatically judges a kind of a review apparatus. If units of the filter 7 and the sampler 8, which are used for review, are used, it is possible to automatically determine a kind of a review apparatus according to a kind of a selected defect as a review target. To be more specific, in a step 501, defect information is read, and in a step 502, filter processing and sampling processing are executed. Then, in a step 503, judgment is made as to whether or not concerning a selected defect, there is a defect detected before this inspection process. If there is a defect detected before, it is automatically judged that instead of the SEM review apparatus 42, the optical review apparatus 41 should be used. After that, the process proceeds to a step 504 to output data 52 to the optical review apparatus 41.

In addition, after the filter 7 for defect size is used, if it is judged in a step 505 that a defect is too minute to be seen using the optical review apparatus 41 for a condition of the extraction size, the process proceeds to a step 506 to provide the SEM review apparatus 42 with defect data 53 directly.

Applying the way of thinking described above in reverse enables automatic determination of a filter condition and a sampling condition. To be more specific, if the optical review apparatus is specified as a review apparatus, the filter for defect size is automatically selected in order to exclude minute defects, which cannot be reviewed by the optical review apparatus, from defects as review targets. Moreover, in the case of the SEM review apparatus, the filter for excluding defects detected before this inspection process is selected.

Figure 6:
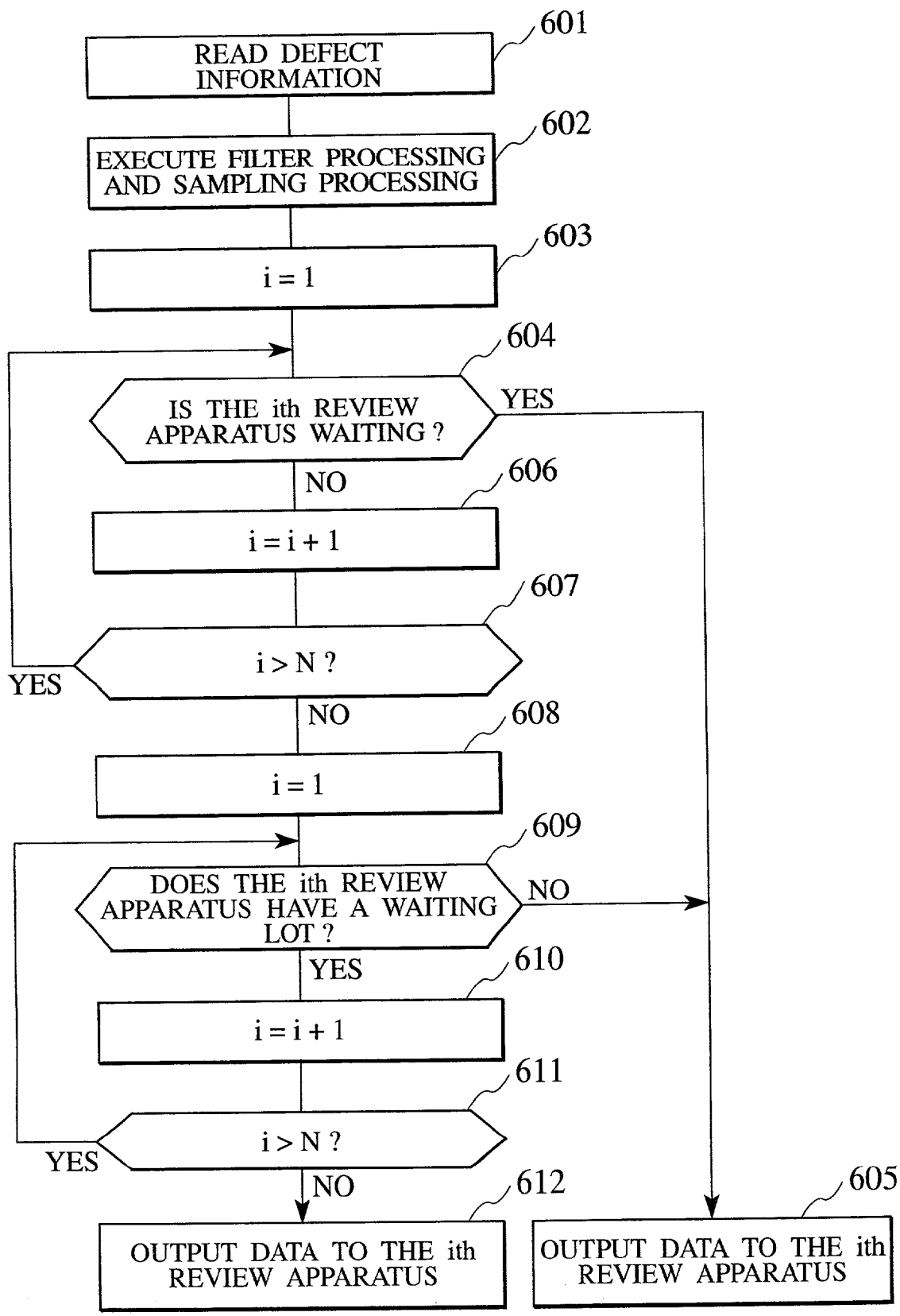
FIG. 6 is a flowchart illustrating processing that automatically selects a review apparatus from among a plurality of review apparatuses of the same kind.

FIG. 6 is a flowchart illustrating processing that automatically selects a review apparatus, which should be used this time, from among a plurality of review apparatuses of the same kind. In a usual semiconductor manufacturing process, as shown in FIG. 4, not only two or more kinds of review apparatuses 41, 42 but also a plurality of review apparatuses 411 through 413 of the same kind, and a plurality of review apparatuses 421 through 423 of the same kind, are often placed. In such a case, it is possible to determine the ith review apparatus, which should be used for review, by judgment based on information as to whether or not each review apparatus is working for review (step 604) and as to whether or not there is a lot in process (step 609), which are based on device state information. If the device state information is directly obtained from a review apparatus, it is desirable to obtain the device state information from a higher level management system, such as a MES system, that has information on a lot state and a device state of a semiconductor production line.

According to the embodiment described above, using the visual inspecting apparatus 3, the review apparatus 4, and the data processor 5 in combination, it is possible to realize highly efficient review work by obtaining narrowed defect information 51 extracted from an enormous amount of defect information 31, which has been output from the visual inspecting apparatus 3, according to an appropriate selecting criterion and an appropriate ratio to provide the review apparatus 4 with the defect information.

According to the present invention, it is possible to narrow down an enormous amount of defect information appropriately for review, and thereby efficiency in review work can be increased. Moreover, if automatic selection of a review apparatus is used, review work with higher efficiency can be realized. This exhibits an effect of improving yields.

Although the invention has been described in its preferred embodiments with a certain degree of particularity, obviously many changes and variations are possible therein. It is therefore to be understood that the present invention may be practiced otherwise than as specifically described herein without departing from the scope and spirit thereof.

What is claimed is:

1. A review work supporting system, comprising:
   a visual inspecting apparatus for detecting an unusual condition of outward appearance of an object to be inspected to output defect information;
   a review apparatus for verifying a defect on the basis of the defect information; and
   a data processor that receives or transfers information between the visual inspecting apparatus and the review apparatus;
   wherein in order to select a small amount of defect information from among a large amount of defect information obtained from the visual inspecting apparatus, said data processor has a sampling function for narrowing down defect data according to a plurality of rules, selects the small amount of defect information by using the plurality of sampling rules in combination to transmit the selected defect information to the review apparatus.

2. A review work supporting system, comprising:
   a visual inspecting apparatus for detecting an unusual condition of outward appearance of an object to be inspected to output defect information;
   a review apparatus for verifying a defect on the basis of the defect information; and
   a data processor that receives or transfers information between the visual inspecting apparatus and the review apparatus;
   wherein in order to select a small amount of defect information from among a large amount of defect information obtained from the visual inspecting apparatus, said data processor has a filter function for narrowing down defect information on the basis of sorting criteria corresponding to characteristics of a defect for a scheduled item, and a sampling function for narrowing down defect data according to a scheduled rule, and narrows down the large amount of defect information to the small amount of defect information by using these functions in combination to transmit the narrowed defect information to the review apparatus.

3. A review work supporting system, comprising:
   a visual inspecting apparatus for detecting an unusual condition of outward appearance of an object to be inspected to output defect information;
   a review apparatus for verifying a defect on the basis of the defect information; and
   a data processor that receives or transfers information between the visual inspecting apparatus and the review apparatus;
   wherein in order to select a small amount of defect information from among a large amount of defect information obtained from the visual inspecting apparatus, said data processor has a filter function for narrowing down defect information on the basis of sorting criteria corresponding to characteristics of a defect for a plurality of items, and a sampling function for narrowing down defect data according to a plurality of rules, and narrows down the large amount of defect information to the small amount of defect information by combined use of both the filter function using a combination of the plurality of items and the sampling function using a combination of the plurality of rules to transmit the narrowed defect information to the review apparatus.

4. A review work supporting system, comprising:
   a visual inspecting apparatus for detecting an unusual condition of outward appearance of an object to be inspected to output defect information;
   a review apparatus for verifying a defect on the basis of the defect information; and
   a data processor that receives or transfers information between the visual inspecting apparatus and the review apparatus;
   wherein the data processor comprises:
   a storage device for registering filter conditions used for narrowing down defect information according to sorting criteria corresponding to defect characteristics for a plurality of items, and sampling conditions used for narrowing down defect data according to a plurality of rules, after the filter conditions and the sampling conditions are combined with one another and sequenced;
   a means for narrowing down information on defects as review targets by reading the conditions, which have been registered on the basis of information on a wafer as a review target, and by filtering and sampling the information on defects according to the read conditions; and
   a means for transmitting the narrowed defect information to the review apparatus.

* * * * *